(12) United States Patent
Latham

(10) Patent No.: US 9,354,284 B2
(45) Date of Patent: May 31, 2016

(54) MAGNETIC FIELD SENSOR CONFIGURED TO MEASURE A MAGNETIC FIELD IN A CLOSED LOOP MANNER

(71) Applicant: Allegro Microsystems, LLC, Worcester, MA (US)

(72) Inventor: Alexander Latham, Harvard, MA (US)

(73) Assignee: ALLEGRO MICROSYSTEMS, LLC, Worcester, MA (US)

( * ) Notice: Subject to any disclaimer, the term of this patent is extended or adjusted under 35 U.S.C. 154(b) by 141 days.

(21) Appl. No.: 14/271,620

(22) Filed: May 7, 2014

(65) Prior Publication Data

US 2015/0323612 A1 Nov. 12, 2015

(51) Int. Cl.
*G01R 33/09* (2006.01)
*G01R 33/07* (2006.01)
(Continued)

(52) U.S. Cl.
CPC ............ *G01R 33/09* (2013.01); *G01R 33/0041* (2013.01); *G01R 33/07* (2013.01); *G01R 33/093* (2013.01); *G01R 33/096* (2013.01); *G01R 33/098* (2013.01)

(58) Field of Classification Search
CPC ...................................................... G01R 33/09
USPC ........................................................ 324/252
See application file for complete search history.

(56) References Cited

U.S. PATENT DOCUMENTS

| 4,385,283 A | 5/1983 | Delapierre |
| 5,247,278 A | 9/1993 | Pant et al. |

(Continued)

FOREIGN PATENT DOCUMENTS

| DE | 10017374 B4 | 12/2000 |
| DE | 10159607 A1 | 9/2002 |

(Continued)

OTHER PUBLICATIONS

S. Yamada, et al., "Eddy-Current Testing Probe with Spin-Valve Type GMR Sensor for Printed Circuit Board Inspection," IEEE Trans. Magn., vol. 40, pp. 2676-2678, Jul. 2014.

(Continued)

*Primary Examiner* — Bot Ledynh
(74) *Attorney, Agent, or Firm* — Daly, Crowley, Mofford & Durkee, LLP

(57) ABSTRACT

A magnetic field sensor for sensing an external magnetic field includes at least one magnetic field sensing element for measuring a magnetic field produced by a first magnetic field generating source and a current generator configured to receive one or more drive current signals at an input thereof and to generate a drive current signal having a periodic waveform and an amplitude offset at an output thereof. Also included is a second magnetic field generating source configured to receive the drive current signal at an input thereof and in response thereto, provide a magnetic field to the at least one magnetic field sensing element. Additionally included is a comparator configured to receive a reference voltage as a first input and an output signal from the at least one magnetic field sensing element as a second input, and in response thereto to generate a comparator output signal having a duty cycle. Further included is a compensation circuit configured to receive the comparator output signal having a duty cycle at an input thereof and to generate an offset signal for correcting the duty cycle to a predetermined duty cycle as an output. A corresponding method is also provided.

33 Claims, 5 Drawing Sheets

(51) Int. Cl.
*G01B 7/30* (2006.01)
*G01R 33/00* (2006.01)

(56) References Cited

U.S. PATENT DOCUMENTS

| | | | |
|---|---|---|---|
| 5,366,815 A | 11/1994 | Araki et al. |
| 5,521,501 A | 5/1996 | Dettmann et al. |
| 5,561,366 A | 10/1996 | Takahashi et al. |
| 5,686,838 A | 11/1997 | Van den Berg |
| 5,831,426 A | 11/1998 | Black, Jr. et al. |
| 6,071,655 A | 6/2000 | Faulconer |
| 6,094,330 A | 7/2000 | Criniti et al. |
| 6,316,931 B1 | 11/2001 | Nakagawa et al. |
| 6,323,634 B1 | 11/2001 | Nakagawa et al. |
| 6,411,078 B1 | 6/2002 | Nakagawa et al. |
| 6,424,018 B1 | 7/2002 | Ohtsuka |
| 6,429,640 B1 | 8/2002 | Daughton et al. |
| 6,433,981 A1 | 8/2002 | Fletcher et al. |
| 6,445,171 B2 | 9/2002 | Sandquist et al. |
| 6,462,531 B1 | 10/2002 | Ohtsuka |
| 6,544,078 B2 | 4/2003 | Palmisano et al. |
| 6,566,856 B2 | 5/2003 | Sandquist et al. |
| 6,642,705 B2 | 11/2003 | Kawase |
| 6,667,682 B2 | 12/2003 | Wan et al. |
| 6,683,448 B1 | 1/2004 | Ohtsuka |
| 6,759,841 B2 | 7/2004 | Goto et al. |
| 6,791,313 B2 | 9/2004 | Ohtsuka |
| 6,812,687 B1 | 11/2004 | Ohtsuka |
| 6,841,989 B2 | 1/2005 | Goto et al. |
| 6,970,333 B2 | 11/2005 | Boeve |
| 6,975,110 B2 | 12/2005 | Kaiju et al. |
| 6,989,665 B2 | 1/2006 | Goto |
| 7,248,045 B2 | 7/2007 | Shoji |
| 7,336,064 B2 | 2/2008 | Ludwig et al. |
| 7,495,624 B2 | 2/2009 | Daalmans |
| 2002/0180431 A1 | 12/2002 | Torok et al. |
| 2006/0071655 A1 | 4/2006 | Shoji |
| 2006/0091993 A1 | 5/2006 | Shoji |
| 2006/0114098 A1 | 6/2006 | Shoji |
| 2006/0145690 A1 | 7/2006 | Shoji |
| 2006/0170529 A1 | 8/2006 | Shoji |
| 2006/0291106 A1 | 12/2006 | Shoji |
| 2007/0044370 A1 | 3/2007 | Shoji |
| 2007/0076332 A1 | 4/2007 | Shoji et al. |
| 2007/0090825 A1 | 4/2007 | Shoji |
| 2007/0096716 A1 | 5/2007 | Shoji |
| 2007/0188946 A1 | 8/2007 | Shoji |
| 2009/0212765 A1 | 8/2009 | Doogue et al. |
| 2009/0315543 A1 | 12/2009 | Guo et al. |
| 2010/0001715 A1 | 1/2010 | Doogue et al. |
| 2010/0026288 A1 | 2/2010 | Sauber et al. |
| 2010/0026289 A1 | 2/2010 | Taylor et al. |

FOREIGN PATENT DOCUMENTS

| | | |
|---|---|---|
| DE | 10128150 C1 | 1/2003 |
| DE | 10155423 B4 | 5/2003 |
| DE | 10202287 C1 | 8/2003 |
| DE | 10222395 A1 | 12/2003 |
| DE | 102004003369 A1 | 8/2005 |
| DE | 102004009267 B3 | 9/2005 |
| DE | 102004038847 B3 | 9/2005 |
| DE | 102004040079 B3 | 12/2005 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 B4 | 3/2007 |
| DE | 10 2005 037 036 A1 | 4/2007 |
| DE | 10 2005 037 036 A1 | 4/2007 |
| DE | 102005052688 A1 | 5/2007 |
| DE | 10 2005 037 036 B4 | 7/2007 |
| DE | 102006007770 A1 | 8/2007 |
| DE | 102006028698 B3 | 12/2007 |
| DE | 102006046736 B4 | 4/2008 |
| DE | 102006046739 B4 | 4/2008 |
| WO | WO 2006/136577 A1 | 12/2006 |
| WO | WO 2007/147760 A2 | 12/2007 |

OTHER PUBLICATIONS

Taylor, et al., "A Spin-Valve Based SOIC8 Current Sensor," 4 pages, Aug. 2006.

Manuel Román, Guillermo Velasco, Alfonso Conesa, Felipe Jeréz, Low Consumption Flux-Gate Transducer, Bodo's Power Systems, Jul. 2009, pp. 34-37.

Sensor Signal Conditioning IC for Closed-Loop Magnetic Current Sensor, Texas Instruments, Jun. 2006, Revised May 2009, pp. 1-36.

Office Action dated Jun. 21, 2010 for U.S. Appl. No. 12/183,541; 12 pages.

Response to Office Action filed Sep. 20, 2010 for U.S. Appl. No. 12/183,541; 17 pages.

Final Office Action dated Dec. 3, 2010 for U.S. Appl. No. 12/183,541; 13 pages.

Response to Office Action filed Feb. 17, 2011 for U.S. Appl. No. 12/183,541; 13 pages.

Notice of Allowance dated Mar. 11, 2011 for U.S. Appl. No. 12/183,541; 5 pages.

Office Action dated Mar. 18, 2011 for U.S. Appl. No. 12/183,106; 10 pages.

MAGNETIC FIELD SENSOR CONFIGURED TO MEASURE A MAGNETIC FIELD IN A CLOSED LOOP MANNER

CROSS REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors and, more particularly, to a magnetic field sensor configured to measure a magnetic field in a closed loop manner.

BACKGROUND

Magnetic field sensors can be used in a variety of applications. In one application, a magnetic field sensor can be used to detect a direction of a magnetic field, more particularly an angle of the direction of a magnetic field. In another application, a magnetic field sensor can be used to sense an electrical current.

Additionally, magnetic field sensors can be configured in a wide variety of manners, including in so-called "open-loop" and "closed-loop" arrangements. In an open-loop arrangement, for example, magnetic field sensors generally sense an angle of the direction of a magnetic field by measuring magnetic induction in an air-gap of a magnetic circuit surrounding a primary magnetic field conductor. In contrast, in a closed-loop arrangement magnetic field sensors generally sense an angle of a direction of a magnetic field by relying on the principle of current compensation in which current generated by a primary magnetic field conductor is compensated by current flow driven through a compensating coil, also known as a secondary coil, by means of an electrical circuit controlled by a magnetic field sensor placed in an air-gap of a magnetic circuit surrounding the primary magnetic field conductor. In such an arrangement, current is driven in a magnetic field generating source until the magnetic field measured by the magnetic field sensor is zero, meaning that the current driven in the magnetic field generating source has fully cancelled the field produced by the current being measured. In particular, the current flowing in the magnetic field generating source is substantially proportional to the magnetic field. In this way, magnetic field sensors configured in a closed-loop arrangement function at the same operating point irrespective of the magnitude of the current being measured such that non-linearity and temperature dependence characteristics of the magnetic field sensor become (ideally) irrelevant to operation of the magnetic field sensor.

One advantage of configuring a magnetic field sensor in a closed-loop arrangement is that in practical magnetic field measurement systems sensitivity changes (ratio change between a small change in an input physical signal to a small change in an output electrical signal) resulting from temperature, stress, etc. do not affect the accuracy of the measured magnetic field as much as they do in an open-loop arrangement. Nonetheless, in very high accuracy applications, even relatively small accuracy deviations (also known as "offset errors") found in typical closed-loop arrangements can be detrimental to magnetic field measurement.

In certain magnetic field sensors, including those comprising giant magnetoresistance (GMR) elements (i.e., which directly detects magnetic field rather than the rate of change in magnetic field), offset errors can arise due to a phenomenon known as hysteresis, which can also be detrimental to magnetic field measurement. GMR elements, for example, generally do not measure the same output value when a generated magnetic field is cycled up or down, resulting in an offset error. The width of the offset error is typically associated with the hysteresis of the GMR element, with the size of the offset error depending not only upon the amount of hysteresis of the GMR element but also the difference in the polarity and magnitudes of the applied fields that the GMR element was recently exposed to.

In linear magnetic field sensing applications, for example, hysteresis can be especially problematic with the magnetic field sensing elements being extremely sensitive to small changes in magnetic field, especially if the magnetic field to be measured is particularly variable in nature and magnitude. Although there are known systems and methods for reducing hysteresis in a given magnetic field sensing element (e.g., GMR element), the systems and methods can be power consuming and costly and difficult to implement.

SUMMARY

The present disclosure provides a magnetic field sensor and associated methods that reduces effects of hysteresis of a magnetic field sensing element in sensing an external magnetic field.

In one aspect, a magnetic field sensor for sensing an external magnetic field includes at least one magnetic field sensing element for measuring a magnetic field produced by a first magnetic field generating source. The magnetic field sensor additionally includes a current generator configured to receive one or more drive current signals at an input thereof and to generate a drive current signal having a periodic waveform and an amplitude offset at an output thereof. The magnetic field sensor also includes a second magnetic field generating source configured to receive the drive current signal at an input thereof and in response thereto, provide a magnetic field to the at least one magnetic field sensing element. The magnetic field sensor further includes a comparator configured to receive a reference voltage as a first input and an output signal from the at least one magnetic field sensing element as a second input, and in response thereto to generate a comparator output signal having a duty cycle.

Additionally, the magnetic field sensor includes a compensation circuit configured to receive the comparator output signal having a duty cycle at an input thereof and to generate an offset signal for correcting the duty cycle to a predetermined duty cycle as an output wherein a characteristic of the offset signal is that it is proportional to a magnitude of the external magnetic field experienced by the magnetic field sensing element when the duty cycle of the comparator output signal is substantially the same as the predetermined duty cycle. The compensation circuit can include a controller configured to generate an offset signal for correcting the duty cycle as an output.

In other embodiments, the magnetic field sensor additionally includes a temperature compensation circuit coupled to the first input of said comparator to adjust the reference voltage in response to temperature changes. The magnetic field sensor also includes a memory device coupled to an input of said comparator with said memory device configured to store a plurality of reference voltage values with each of the plurality of reference voltage values associated with at least one temperature range. The magnetic field sensor further includes a digital-to-analog converter (DAC) coupled between said memory device and the first input of said comparator, wherein said DAC converts a digital representation of a reference voltage value retrieved from said memory device to an analog voltage. Additionally, the magnetic field sensor includes a temperature sensor coupled to said memory device, wherein said temperature sensor senses a temperature and outputs a temperature sensing value to said memory device.

In other embodiments, the magnetic field generating source of the magnetic field sensor comprises an H-bridge circuit coupled to a coil. In another embodiment, the compensation circuit of the magnetic field sensor comprises a controller configured to generate an offset signal for correcting the duty cycle as an output. In yet another embodiment, the offset signal of the magnetic field sensor is generated in response to the duty cycle of the comparator output signal. In yet another embodiment, the at least one magnetic sensing element of the magnetic field sensor is a magnetoresistance element. In some embodiments, the magnetoresistance element is an anisotropic magnetoresistance (AMR) element. In other embodiments, the magnetoresistance element is one of a giant magnetoresistance (GMR) element; a tunneling magnetoresistance (TMR) element; a magnetic tunnel junction (MTJ) element; or a spin valve element. In yet other embodiments, the at least one magnetic sensing element is Hall effect element.

In yet another embodiment, the periodic waveform of the magnetic field sensor is substantially symmetric, while in another embodiment the period waveform is triangular. In yet another embodiment, the drive current signal of the magnetic field sensor has an amplitude selected to drive the magnetic field sensing element into saturation. In another embodiment, the drive current signal is associated with the offset signal. In yet another embodiment, the output of the magnetic field sensor is the offset signal, wherein the offset signal may comprise an analog voltage or a representative digital value. In another embodiment, the output of the magnetic field sensor is the drive current signal. In yet another embodiment, the compensation circuit is configured to generate the offset signal such that the duty cycle of the comparator output signal remains a fixed value, wherein the fixed value is the predetermined duty cycle. In some embodiments, the fixed value is 50 percent.

In another aspect, a method for sensing an external magnetic field includes generating a drive current signal having a periodic waveform and an amplitude offset at an output thereof. The method additionally includes generating a magnetic field from said drive current signal and applying said magnetic field to a magnetic field sensing element. The method also includes comparing an output of the magnetic field sensing element to a reference signal to generate a comparison output signal having a duty cycle characteristic. The method further includes generating an offset signal for correcting the duty cycle from the comparison output signal to a predetermined duty cycle wherein a characteristic of the offset signal is that it is proportional to the external magnetic field experienced by the magnetic field sensing element when the duty cycle of the comparison output signal is substantially the same as the predetermined duty cycle.

In other embodiments, the method additionally includes providing an output of the magnetic sensing element to a first input of a comparator, providing a reference voltage to a second input of the comparator, generating a comparison output signal from said first input and said second input of the comparator, wherein said comparison signal has a duty cycle, and providing the comparison output signal to an input of a compensation circuit. In another embodiment, providing a reference voltage to a second input of the comparator includes converting a digital value to an analog voltage and providing the analog voltage to the second input of the comparator. In yet another embodiment, providing a reference voltage to a second input of the comparator includes storing a plurality of reference voltage values in a memory device with each of the reference voltage values being associated with at least one temperature range, selecting a reference voltage, converting the reference voltage value to an analog voltage, and providing the analog voltage to the second input of the comparator.

In another embodiment, providing a reference voltage to a second input of the comparator includes sensing a temperature, generating a temperature sensing value as a digital value, converting the digital value to an analog voltage, and providing the analog voltage to the second input of the comparator. In yet another embodiment, generating a magnetic field from said drive current signal and applying said magnetic field to a magnetic field sensing element includes generating the magnetic field with an H-bridge circuit coupled to a coil which receives said drive current signal.

In yet another embodiment, generating an offset signal for correcting the duty cycle from the comparison output signal wherein a characteristic of the offset signal is that it is proportional to the external magnetic field experienced by the magnetic sensing element in steady-state includes receiving said comparison output signal and generating an offset signal for correcting the duty cycle from said comparison output signal in a controller wherein a characteristic of the offset signal is proportional to the external magnetic field experienced by the magnetic sensing element when the duty cycle of the comparison output signal is substantially the same as the predetermined duty cycle. In another embodiment, the drive current signal is associated with the offset signal.

In yet another embodiment, generating a drive current signal having a periodic waveform and an amplitude offset at an output thereof includes generating a drive current signal having a substantially symmetric periodic waveform and an amplitude offset at an output thereof. In yet another embodiment, generating a drive current signal having a periodic waveform and an amplitude offset at an output thereof includes generating a drive current signal having a triangular periodic waveform and an amplitude offset at an output thereof. In yet another embodiment, generating a drive current signal having a periodic waveform characteristic with an offset includes generating a drive current signal having an amplitude selected to drive the magnetic field sensing element into saturation.

BRIEF DESCRIPTION OF THE DRAWINGS

The foregoing features of the disclosure, as well as the disclosure itself may be more carefully understood from the following detailed description of the drawings, which.

DETAILED DESCRIPTION

Figure 1:
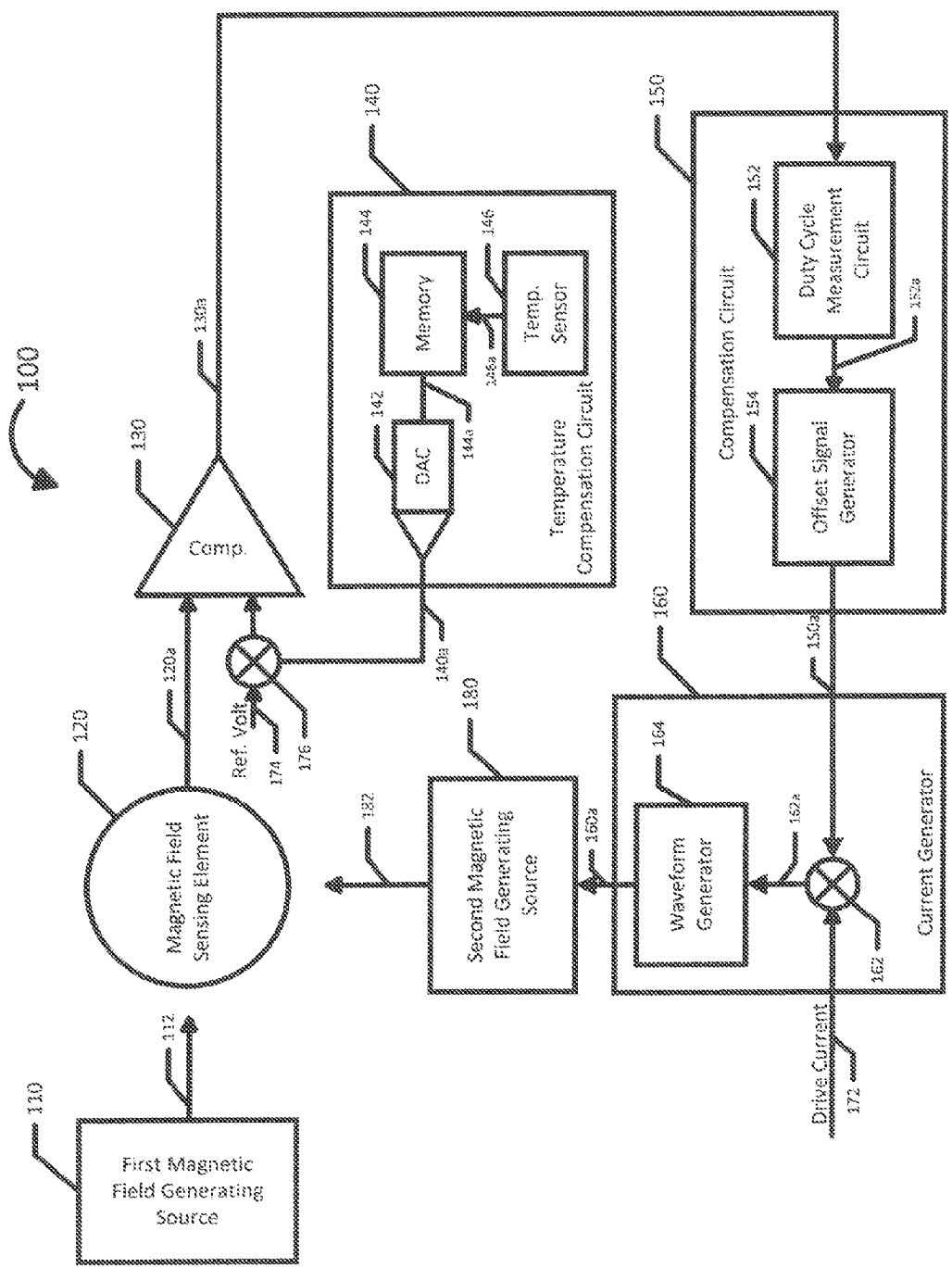
FIG. 1 is a block diagram of an exemplary magnetic field sensor.

The features and other details of the disclosure will now be more particularly described. It will be understood that particular embodiments described herein are shown by way of illustration and not as limitations of the concepts, systems and techniques described herein. The principal features of this disclosure can be employed in various embodiments without departing from the scope of the disclosure.

DEFINITIONS

For convenience, certain introductory concepts and terms used in the specification are collected here.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

Before describing the present disclosure, it should be noted that reference is sometimes made herein to assemblies having a particular shape (e.g., rectangular). One of ordinary skill in the art will appreciate, however, that the techniques described herein are applicable to a variety of sizes and shapes.

Referring now to FIG. 1, an exemplary magnetic field sensor 100 comprises a first magnetic field generating source 110 configured to generate a magnetic field 112 (or external magnetic field) and a magnetic field sensing element 120 configured to sense the magnetic field 112. The first magnetic field generating source 110 can, for example, generate the magnetic field 112 across a magnetic coil or a solenoid, but other suitable means for generating the magnetic field 112 can also be used. The first magnetic field generating source 110 can be a device under test (DUT), for example, such as a camshaft positioning magnet or a magnet on a magneto-optical drive. The magnetic field 112 can also be generated by a plurality of magnetic field generating sources, which can be the same as or similar to the first magnetic field generating source 110. The at least one magnetic field sensing element 120 for sensing the magnetic field 112 can, for example, comprise a giant magnetoresistance (GMR) element having hysteresis, but it is not so limited. Additionally, the at least one magnetic field sensing element 120 can be selected based upon a particular application and desired sensor output characteristics.

The magnetic field sensor 100 additionally includes a comparator 130 configured to receive a reference voltage signal 174 at a first input thereof and an output signal 120a from the at least one magnetic field sensing element 120 at a second input thereof. In response thereto, the comparator 130 is configured to generate a comparator output signal 130a, which comprises a duty cycle (a "first duty cycle").

The magnetic field sensor 100 also includes a compensation circuit 150 configured to receive the comparator output signal 130a at an input thereof and in response thereto generate an offset signal 150a. The magnetic field sensor 100 further includes a current generator 160 configured to receive the offset signal 150a and a drive current signal 172 (e.g., alternating current signal) at inputs thereof and, in response thereto, the current generator 160 adds the drive current signal 172 to the offset signal 150a in a nonlinear device, such as a mixer, to produce a current signal 162a. The drive current signal 172a, like the comparator output signal 130a, comprises a duty cycle (a "second duty cycle"). The second duty cycle, according to a preferred embodiment, is at or around 50 percent. It is to be appreciated, that when the first duty cycle of the comparator output signal 130a and the second duty cycle of the drive current signal 172 are the same or substantially similar, the offset signal 150a is representative of an output signal of the magnetic field sensor 100 having a linear relationship with, the magnetic field 112 generated by the first magnetic field generating source 110.

As is known, it is generally ideal for an output signal generated by a magnetic field sensor to have a linear relationship with an applied magnetic field. In a preferred embodiment, the magnetic field sensor 100 drives the first duty cycle of the comparator output signal 130a and the second duty cycle of the drive current signal 172 to be the same or substantially similar irrespective of the actual duty cycle value (e.g., a first and second duty cycle value of 50 percent or a first and second duty cycle value of 40 percent). Specifically, in some embodiments, the actual values of the first and second duty cycles are not essential to operation of the magnetic field sensor 100. Rather, in these embodiments the key is that the first and second duty cycles comprise the same or a substantially similar duty cycle value (e.g., both being 50 percent, 45 percent, 40 percent, etc.).

Figure 2:
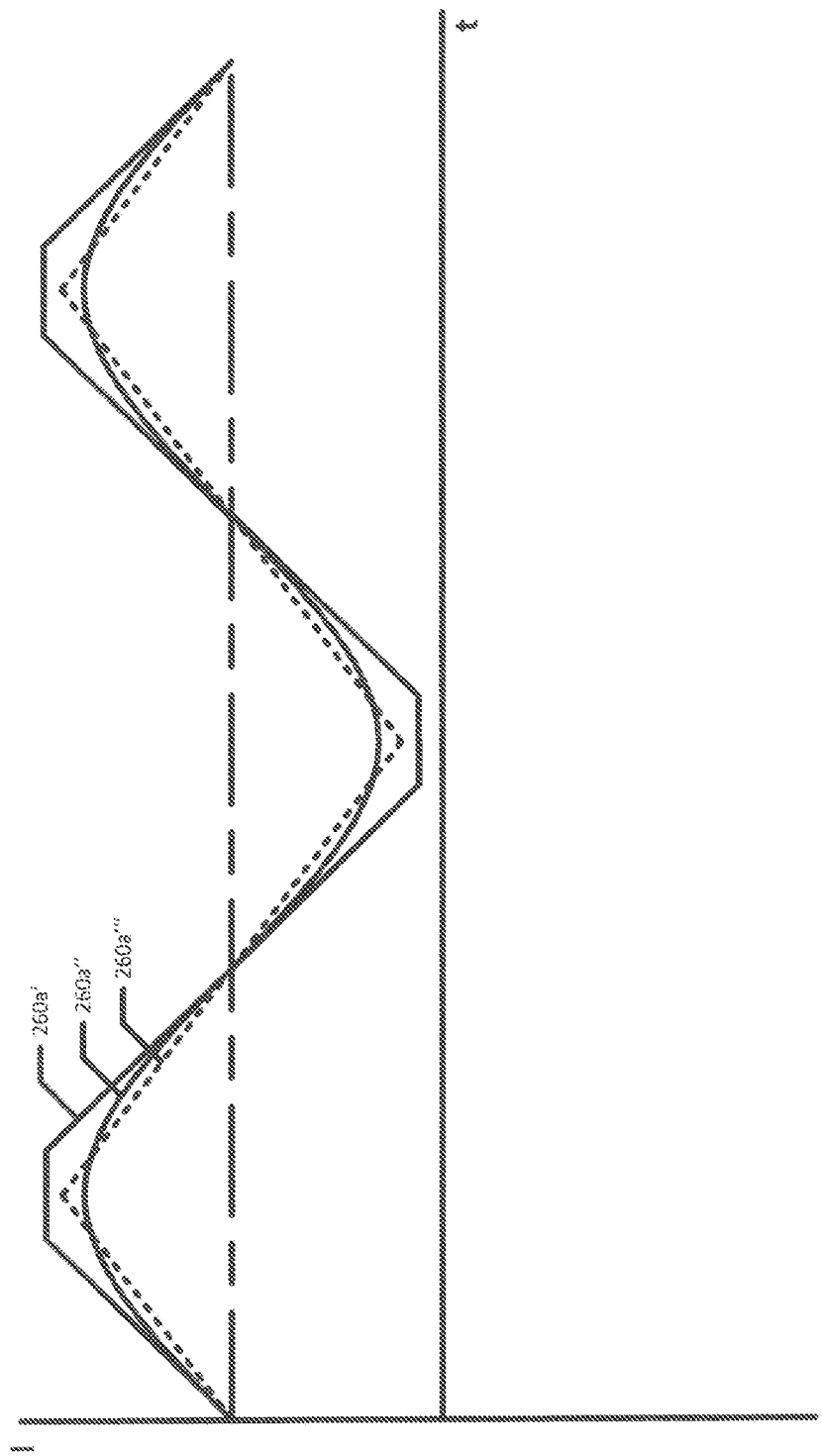
FIG. 2 is a plot illustrating exemplary drive current signals generated in accordance with an example offset signal.

The magnetic field sensor 100 additionally includes a waveform generator 164 configured to receive the current signal 162a at an input thereof and in response thereto generate a drive current signal 160a having a periodic waveform at an output thereof. In some embodiments, the periodic waveform of the drive current signal 160a is symmetric (i.e., representative of a signal with a 50 percent duty cycle) while in other embodiments the periodic waveform is both symmetric and triangular. The periodic waveform can also take the shape of a sine wave or a square wave. It should be appreciated that substantially any periodic waveform, a waveform confined to a periodic variation of time and distance with a positive peak and a negative trough, can be representative of the periodic waveform of the drive current signal 160a. Examples drive current signals 160a having periodic waveforms are shown in FIG. 2, for example.

The magnetic field sensor 100 further includes a second magnetic field generating source 180 configured to receive the drive current signal 160a at an input thereof and in response thereto provide a magnetic field 182 to the at least one magnetic field sensing element 120. The second magnetic field generating source 180 can, for example, be the same as or similar to the first magnetic field generating source 110. In a preferred embodiment, the magnetic field 182 drives the at least one magnetic field sensing element 120 into saturation. In particular, when the magnetic field 182 produces no further change in resistance in the at least one magnetic field sensing element 120, the at least one magnetic field sensing element 120 is deemed saturated. By saturating the at least one magnetic field sensing element 120 (e.g., GMR element) prior to making a magnetic field measurement, the negative effects associated with the hysteresis of the at least one magnetic field sensing element 120 have been shown to be substantially reduced. As such, the magnetic field sensor 100 provides a more accurate magnetic field measurement. Additionally, repeatability of measurements made by the magnetic field sensor 100 is dramatically improved over conventional magnetic field sensors. More details pertaining to saturation of the at least one magnetic field sensing element 120 are discussed in conjunction with FIG. 2.

In some embodiments, the compensation circuit 150 can additionally include a duty cycle measurement circuit 152 and an offset signal generator 154, with the duty cycle measurement circuit 152 coupled to receive the comparator output signal 130a at an input thereof and in response thereto provide a duty cycle adjust signal 152a to the offset signal generator 154 if the first duty cycle of the comparator output signal 130a is not equal to 50 percent or another desired duty cycle. As discussed above, it is desirable for the first duty cycle of the comparator output signal 130a to be the same as or substantially similar to the second duty cycle of the drive current signal 172, neither of which necessarily comprises a duty cycle of 50 percent. An example operation of the duty cycle measurement circuit 152 is discussed further in conjunction with FIGS. 3 and 3A, for example. In some embodiments, the offset signal generator 154, which is coupled to receive the duty cycle adjust signal 152a from the duty cycle measurement circuit 152, comprises a processor (not shown) (e.g. a digital signal processor or other processing element) configured to generate the offset signal 150a with a duty cycle configured to be the same as or substantially similar to the second duty cycle of the drive current signal 172 based upon the duty cycle adjust signal 152a.

Additionally, in some embodiments, the waveform generator 164 of magnetic field sensor 100 is configured to generate a variable amplitude, frequency independent, drive current signal 160a having the periodic waveform over a wide frequency bandwidth. The amplitude of the drive current signal 160a can, for example, be independent of the frequency of the drive current input signal 172 and the offset signal 150a.

Additionally, in some embodiments, the second magnetic field generating source 180 of magnetic field sensor 100 can comprise an H-bridge circuit coupled to a coil and configured to generate the magnetic field 182. Furthermore, the second magnetic field generating source 180 can be configured to generate a substantially uniform magnetic field 182 in either the X-direction, Y-direction, or both X-direction and Y-direction. The strength of the magnetic field 182 generated by the magnetic field generating source 180 can, in some embodiments, is directly proportional to the drive current signal 160a.

Additionally, in some embodiments, the magnetic field sensor 100 can further comprise a temperature compensation circuit 140 coupled to an input of the comparator 130, with the temperature compensation circuit 140 configured to adjust the reference voltage signal 174 in response to temperature changes experienced by the magnetic field sensor 100. In the exemplary magnetic field sensor of FIG. 1, for example, the temperature compensation circuit 140 is shown comprising a memory device 144 coupled to a first input of the comparator 130. The memory device 144 can, for example, be configured to store a plurality of reference voltage signals 174 with each of the plurality of reference voltage signals 174 being associated with at least one temperature range. The temperature compensation circuit 140 can be configured to generate an output signal 140a, with the output signal 140a being coupled to the first input of the comparator 130 through a nonlinear device (e.g., mixer 176). The mixer 176 can be configured to combine output signal 140a with the reference voltage signal 174 and provide a combined signal to a first input of the comparator 130.

In other embodiments, the temperature compensation circuit 140 can further comprise a digital-to-analog converter (DAC) 142 coupled between the memory device 144 and the first input of the comparator 130. With this arrangement, the DAC 142 is configured to convert a digital representation of the reference signal 174 retrieved from the memory device 144 to an analog voltage. In yet other embodiments, the temperature compensation circuit 140 comprises a temperature sensor 146 coupled to the memory device 144. In such arrangement, the temperature sensor 146 can sense a temperature and outputs a temperature sensing value 146a to the memory device 144. The output of the magnetic field sensor 100 can be the offset signal 150a, wherein the offset signal 150a may comprise an analog voltage or a representative digital value. In other embodiments, the output of the magnetic field sensor 100 can be the one or more drive current signals 172.

It is to be appreciated that the components of the exemplary magnetic field sensor 100 disclosed herein, and in particular the magnetic field sensing element 120, comparator 130, compensation circuit 150, current generator 160, and second magnetic field generating source 180, can be provided in a variety of different configurations and comprise multiple elements in digital or analog form or a combination thereof.

Additionally, it is to be appreciated that the magnetic field sensor 100 of FIG. 1 has been described as being comprised of units (e.g., a comparator 130, a compensation circuit 150). It should be appreciated, however, that this is merely a functional description and that software, hardware, or a combination of software and hardware can perform the respective functions of the magnetic field sensor 100 in an equivalent manner. Furthermore, it is to be appreciated that the systems and associated methods disclosed herein can be applied to reduce hysteresis effects resulting from local concentrators having hysteresis being placed near the at least one magnetic field sensing element 120 (as may be done, for example, if element 120 is provided as a Hall effect element).

Additional aspects of the exemplary magnetic field sensor 100 are described in greater detail below in conjunction with FIGS. 2-3A.

Referring now to FIG. 2, shown are exemplary drive signals 260a', 260a", and 260a'" with periodic waveforms, which can be the same as or similar to drive current signal 160a of FIG. 1. As previously discussed in conjunction with FIG. 1, the drive current signals 260a', 260a", and 260a'" can come in a wide variety of shapes and forms. Shown, for example, are a periodic cut-off triangular drive current signal 260a', a sine wave drive current signal 260a", and a triangular drive current signal 260a'". In a preferred embodiment, the frequency and amplitude of the drive current signals 260a', 260a", and 260a'" are selected to match the frequency and amplitude of an output signal (e.g. 120a, shown in FIG. 1) from the at least one magnetic field sensing element (e.g. 120, shown in FIG. 1).

The drive signals 260a', 260a", 260a'", as discussed above in conjunction with FIG. 1, are provided as an input to a magnetic field generating source (e.g., 180, shown in FIG. 1) for providing a magnetic field (e.g., 182, shown in FIG. 1) to the at least one magnetic field sensing element (e.g., 120, shown in FIG. 1) of the exemplary magnetic field sensor (e.g., 100, shown in FIG. 1). In some embodiments, the frequency and amplitude of the drive signals 260a', 260a", 260a'" are selected to drive the at least one magnetic field sensing element (e.g., 120, shown in FIG. 1) into saturation and, according to other embodiments, are additionally selected such that an output signal (e.g., offset signal 150a) of the magnetic field sensor can achieve a duty cycle of 50 percent. As discussed above, a magnetic field sensor output signal with a 50 percent duty cycle is typically representative of a uniform (ideal) output signal (e.g., ideal sine wave). Additionally, as discussed above, when the magnetic field sensor (e.g., 100, shown in FIG. 1) is saturated, the negative hysteresis effects associated with the at least one magnetic field sensing element (e.g., 120, shown in FIG. 1) are substantially reduced.

In saturation, the external magnetic field (e.g., 112, shown in FIG. 1) generated by the magnetic field generating source (e.g., 110, shown in FIG. 1) is generally above a certain magnetic field strength level, which can be related to the particular type of the at least one magnetic field sensing element (e.g., 120, shown in FIG. 1). When the at least one magnetic field sensing element (e.g., 120, shown in FIG. 1) is driven into saturation, the magnetic materials of the at least one magnetic field sensing element (e.g., 120, shown in FIG. 1) can, according to some embodiments, be aligned in the same direction as the external magnetic field (e.g., 112, shown in FIG. 1). As a result, in saturation the output (e.g., 120a, shown in FIG. 1) of the at least one magnetic field sensing element (e.g., 120, shown in FIG. 1) only reflects the direction of the external magnetic field (e.g., 112, shown in FIG. 1) and not its strength. An advantage of operating the at least one magnetic field sensing element (e.g., 120, shown in FIG. 1) in saturation includes immunity to the temperature coefficient of the one or more magnets comprising the at least one magnetic field sensing element (e.g., 120, shown in FIG. 1) and insensitivity to magnetic field strength when the external magnetic field (e.g., 112, shown in FIG. 1) is greater than a saturation level. The saturation level will depend upon the type of magnetic field sensing elements comprising the at least one magnetic field sensing element (e.g., 120, shown in FIG. 1) of the exemplary magnetic field sensor (e.g., 100, shown in FIG. 1), as will be apparent to one of skill in the art.

When entering saturation, the at least one magnetic field sensing element (e.g., 120, shown in FIG. 1) will generally follow a known hysteresis path as the magnetic field (e.g., 112 and/or 182, shown in FIG. 1) applied to the at least one magnetic field sensing element (e.g., 120, shown in FIG. 1) is decreased. This is a key aspect of the exemplary magnetic field sensor (e.g., 100, shown in FIG. 1) and associated methods disclosed herein. By entering saturation in both positive and negative directions of a hysteresis curve, the at least one magnetic field sensing element (e.g., 120, shown in FIG. 1) follows a maximum hysteresis curve. The maximum hysteresis curve should be substantially symmetric, causing a trip point of the comparator (e.g., 130, shown in FIG. 1) to be the same on both sides of the curve. It is notable that even though the saturation point and level of the hysteresis curve for the at least one magnetic field sensing element (e.g., 120, shown in FIG. 1) may change over temperature, the hysteresis curve should nonetheless remain substantially symmetric. A substantially symmetric hysteresis curve is representative of the magnetic field sensing element (e.g., 120, shown in FIG. 1), more particularly the magnetic field sensor (e.g., 100), operating with optimal accuracy.

It is to be appreciated that the drive current signals of the exemplary magnetic field sensor disclosed herein are not limited to the shown drive current signals 260a', 260a", and 260a'".

Figure 2A:
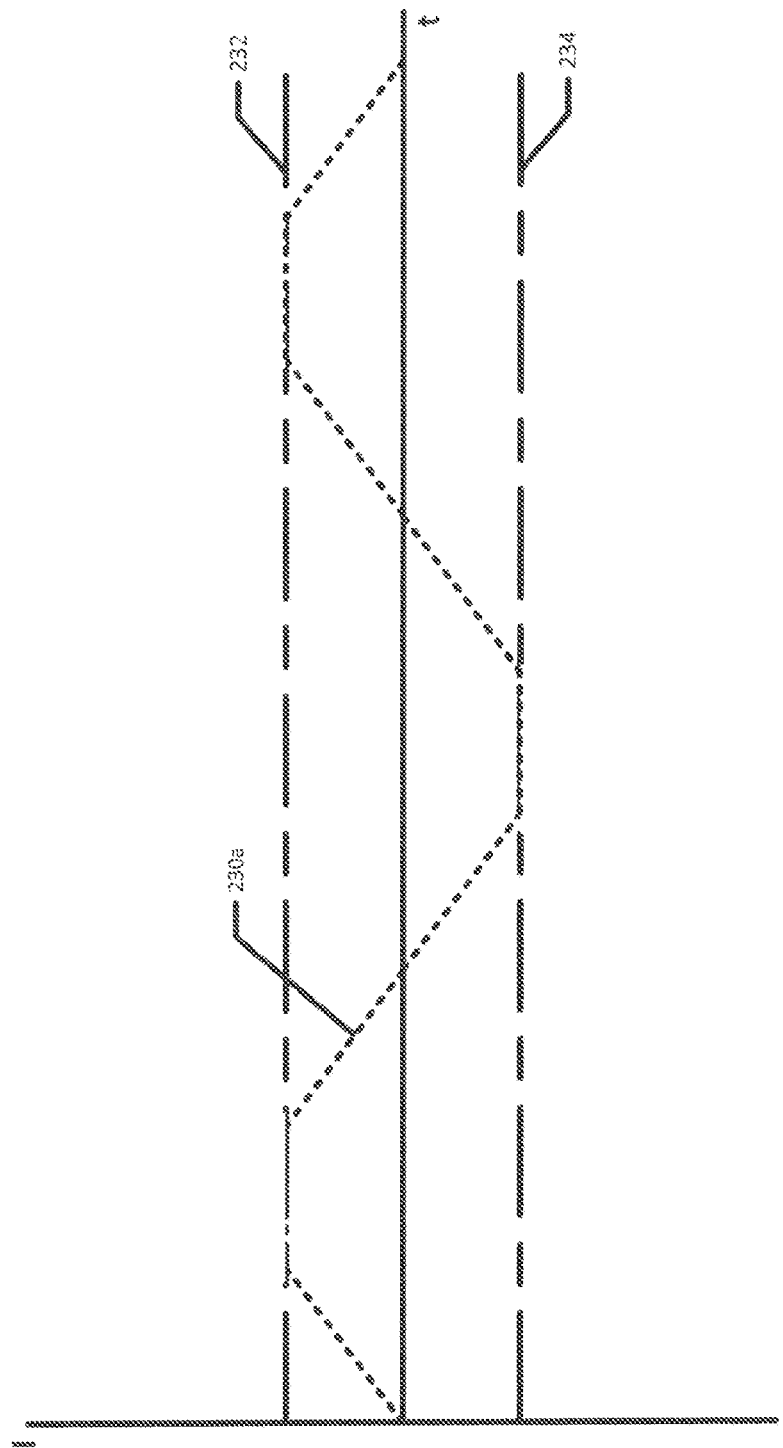
FIG. 2A is a plot illustrating an example comparator output signal having a duty cycle of 50 percent.

Referring now to FIG. 2A, shown is an example comparator output signal 230a, which can be produced by a comparator that is the same as or similar to comparator 130 of FIG. 1. As discussed above in conjunction with FIG. 1, the comparator output signal 230a comprises a first duty cycle. The first duty cycle of the comparator output signal 230a is here shown to be at about 50 percent. It is to be appreciated, however, that the first duty cycle of the comparator output signal 230a, at least in an initial run of the exemplary magnetic field sensor (e.g., 100, shown in FIG. 1), will likely not be 50 percent due to the inherent offset errors of the at least one magnetic field sensing element (e.g., 120, shown in FIG. 1) previously discussed.

The shown comparator output signal 230a may be representative of a substantially saturated output signal (e.g., 120a, shown in FIG. 1) from the at least one magnetic field sensing element (e.g., 120, shown in FIG. 1). The comparator output signal 230a may also be representative of a substantially saturated output signal that is within an upper threshold limit 232 and a lower threshold limit 234 of the comparator (e.g., 130, shown in FIG. 1). The comparator (e.g., 130, shown in FIG. 1) can, for example, be a window comparator. It is to be appreciated that the upper threshold limit 232 and lower threshold limit 234 may be adjusted, for example, based upon the characteristics of the magnetic field sensor (e.g., 100, shown in FIG. 1) or a reference voltage signal (e.g., 174, shown in FIG. 1). It is also to be appreciated that the upper threshold limit 232 and the lower threshold limit 234 may be set independently of one another to be symmetrical about zero or not symmetrical about zero.

Figure 3:
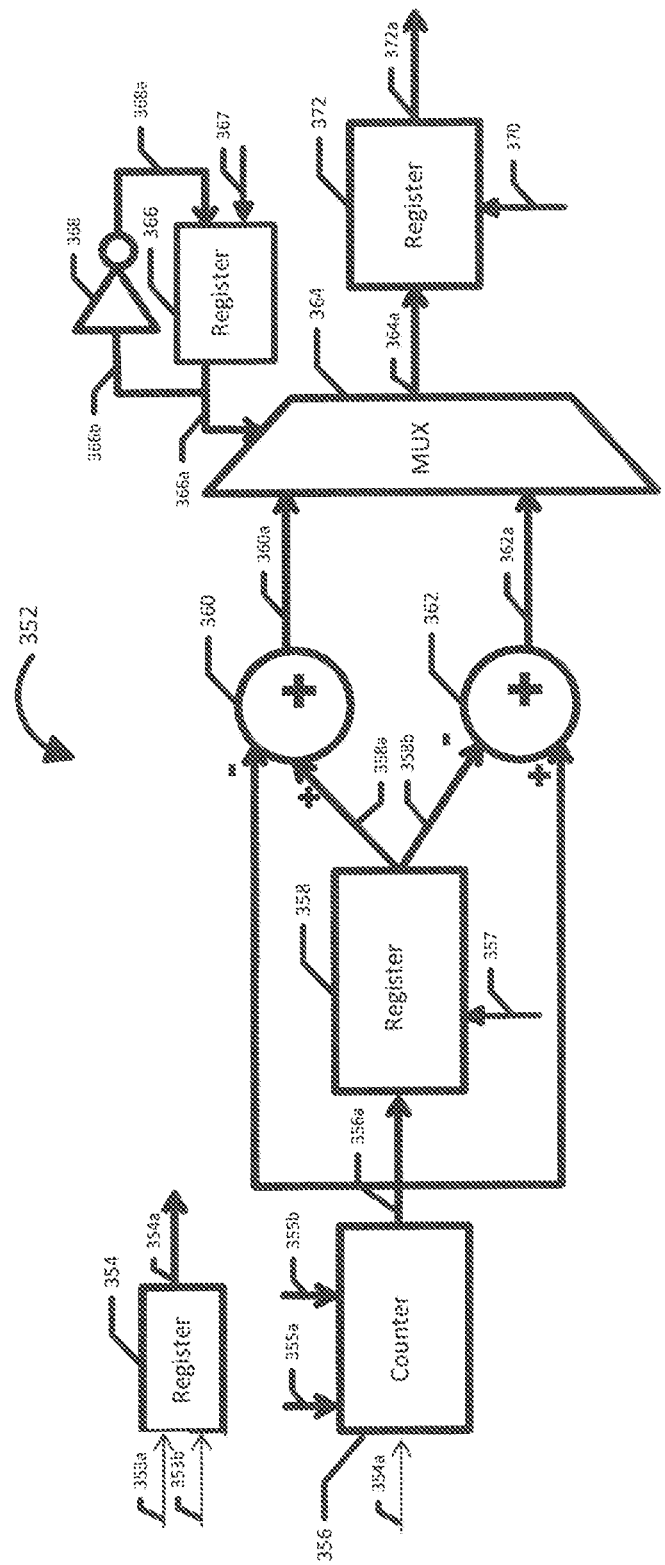
FIG. 3 is a block diagram of an exemplary duty cycle measurement circuit according to certain aspects of the present disclosure.

Referring now to FIG. 3, a duty cycle measurement circuit 352, which can be the same as or similar to duty cycle measurement circuit 152 of FIG. 1 is shown. The duty cycle measurement circuit 352, as previously discussed, may be part of a compensation circuit (e.g., 150, shown in FIG. 1).

The duty cycle measurement circuit 352, as illustrated, comprises a plurality of registers (354, 358, 366, 372), a plurality of summing nodes (360, 362), a counter 356, and a multiplexer 364.

The register 354 is coupled to receive a first comparator output signal 353a having a first duty cycle (like 130a, shown in FIG. 1) and a second comparator output signal 353b having a second duty cycle at inputs thereof and configured to store said signals 353a, 353b. The first comparator output signal 353a can be representative of a current comparator output signal C_out (shown in FIG. 3A), while the second comparator output signal 353b can be representative of a previous comparator output signal C_out_last (shown in FIG. 3A). The register 354 is also configured to compare the first duty cycle of the first comparator output signal 353a and the second duty cycle of the second comparator output signal 353b and produce a difference signal 354a at an output thereof. Ideally, when the at least one magnetic field sensing element (e.g., 120, shown in FIG. 1) of the exemplary magnetic field sensor (e.g., 100, shown in FIG. 1) is saturated, the first duty cycle and the second duty cycle will be the same and comprise a value of 50 percent. As previously discussed, a magnetic field sensor output signal with a 50 percent duty cycle is typically representative of a uniform (ideal) output signal (e.g., ideal sine wave).

The counter 356 is coupled to receive the difference signal 354a, a first count signal 355a, and a reset signal 355b at inputs thereof and in response thereto generate an output count signal 356a at an output thereof. The counter 356, according to some embodiments, is configured to provide the output count signal 356a to the register 358 when the difference signal 354a is not equal to zero (i.e., the first duty cycle of the first comparator output signal 353a is different from the second duty cycle of the second comparator output signal 353b). The output count signal 356a can, for example, be representative of an increased value of the first count signal 355a (e.g., first count signal 355a increased by 1). Additionally, as previously discussed and to be appreciated, ideally the duty cycles of the comparator output signals (353a, 353b) will be the same as or substantially similar to the duty cycle of a drive current signal (e.g., 172, shown in FIG. 1), which does not necessarily need to be 50 percent.

Additionally, the counter 356 can be configured to reset one or more of the difference signal 354a and first count signal 355a via a reset signal 355b. The first count signal 355a can, for example, be reset by the reset signal 355b when the difference signal 354a is equal to zero (i.e., the first duty cycle of the first comparator output signal 353a is the same as the second duty cycle of the second comparator output signal 353b).

The register 358 is coupled to receive the output count signal 356a at an input thereof and in response thereto generate a plurality of counter signals 358a, 358b at an output thereof. The plurality of counter signals 358a, 358b are, according to some embodiments, substantially representative of the first count signal 355a and a third count signal 357. The third count signal 357, according to some embodiments, is received from outside of the duty cycle measurement circuit 352 and is representative of a corrected count signal which is indicative of the difference between the first count signal 355a and a predetermined count signal.

The summing nodes 360, 362 are coupled to receive output count signal 356a and the plurality of counter signals 358a, 358b at inputs thereof and in response thereto generate summed signals 360a, 362a at outputs thereof. The summed signals 360a, 362a are representative of a sum of output count signal 356a and counter signals 358a, 358b, respectively.

The multiplexer 364 is coupled to receive the plurality of summed signals 360a, 362a at inputs thereof and in response thereto generate a multiplexed signal 364a as a selected one of the plurality of summed signals 360a, 362a at an output thereof. In some embodiments, the multiplexer 364 is additionally coupled to receive the plurality of summed signals 360a, 362a and a reference signal 366a from a register 366 at inputs thereof and in response thereto generate a multiplexed signal 364a as a selected one of the plurality of summed signals 360a, 362a based upon said reference signal 366a.

The multiplexer 364 can, for example, choose between summed signals 360a, 362a based upon the polarity of the summed signals 360a, 362a. In some embodiments such can be accomplished by toggling a select a select bit (CE_sel, shown in FIG. 3A) on the multiplexor 364. A multiplexed signal 364a having a value of zero, for example, can be achieved when the duty cycle of the first comparator output signal 353a is substantially the same as a desired duty cycle (e.g., 50 percent, which is typically representative of a uniform (ideal) output signal). The desired duty cycle is representative of a duty cycle of a drive current signal (e.g., 172, shown in FIG. 1).

Alternatively, a multiplexed signal 364a with a positive value can be achieved when the duty cycle of the first comparator output signal 353a is greater than the desired duty cycle (e.g., 55 percent). In yet another alternative, a multiplexed signal 364a with a negative value can be achieved when the duty cycle of the first comparator output signal 353a is less than the desired duty cycle (e.g., 45 percent).

In some embodiments, the multiplexer 364 is also coupled to receive a reference signal 366a from the register 366 at an input thereof. The register 364 is coupled to receive and store a reference signal 367 from outside of the duty cycle measurement circuit 352. The reference signal 367 can, for example, be indicative of reference signal 366a. The register 366 is configured in a feedback loop, which includes a buffer 368. The buffer 368 is coupled to receive the reference signal 366a at an input thereof from the register 366 and configured to generate a buffered reference signal 368a at an output thereof, which is provided at an input thereof of the register 366.

The register 372 is coupled to receive a multiplexed signal 364a and a reference signal 370 at inputs thereof and configured to generate a duty cycle adjust signal 372a at an output thereof. The reference signal 370 can, for example, be representative of the desired duty cycle (e.g., 50 percent). Additionally, the duty cycle adjust signal 372a can, for example, be representative of a difference between the reference signal 370 and the first duty cycle of the first comparator output signal 353a. The duty cycle adjust signal 372a can be analog, digital, or mixed signal and be provided to an offset signal generator (154, shown in FIG. 1) for generating an offset signal (150a, shown in FIG. 1). It is to be appreciated that the duty cycle adjust signal 372a can also be smoothed out with an analog or digital filter and can be the same as or similar to the duty cycle adjust signal 152a of FIG. 1.

In operation, the offset signal generator (e.g., 154, shown in FIG. 1) is coupled to receive the duty cycle adjust signal 372a and configured to generate an offset signal (150a, shown in FIG. 1) having a corrected (or predetermined) duty cycle in accordance with the reference signal 370 (or desired duty cycle, e.g., 50 percent). As previously discussed, when the first duty cycle of the comparator output signal (e.g., 130a, shown in FIG. 1) and the second duty cycle of the drive current signal (e.g., 172, shown in FIG. 1) are the same or substantially similar, the offset signal (e.g., 150a, shown in FIG. 1) is representative of an output signal of the magnetic field sensor (e.g., 100, shown in FIG. 1) having a linear relationship with the magnetic field (e.g., 112, shown in FIG. 1) generated by a magnetic field generating source (e.g., 110, shown in FIG. 1). Additionally, as previously discussed, it is generally ideal for an output signal generated by a magnetic field sensor to have a linear relationship with an applied magnetic field.

It is to be appreciated that the above described offset signal generator (e.g., 154, shown in FIG. 1) can be configured to perform the functions of the duty cycle measurement circuit 352, and vice versa. Additionally, the compensation circuit (150, shown in FIG. 1) can comprise further circuitry, such as a low-pass filter, for filtering the received first comparator output signal 353 with a first duty cycle or the offset signal (e.g., 150a, shown in FIG. 1). Furthermore, it is to be appreciated that the exemplary magnetic field sensor (100, shown in FIG. 1) may require frequent offset signal 150a generations during regular operation of the magnetic field sensor (e.g., 100, shown in FIG. 1) in order to drive the at least one magnetic field sensing element (e.g., 100, shown in FIG. 1) of the magnetic field sensor (e.g., 100, shown in FIG. 1) into saturation, as discussed above.

Figure 3A:
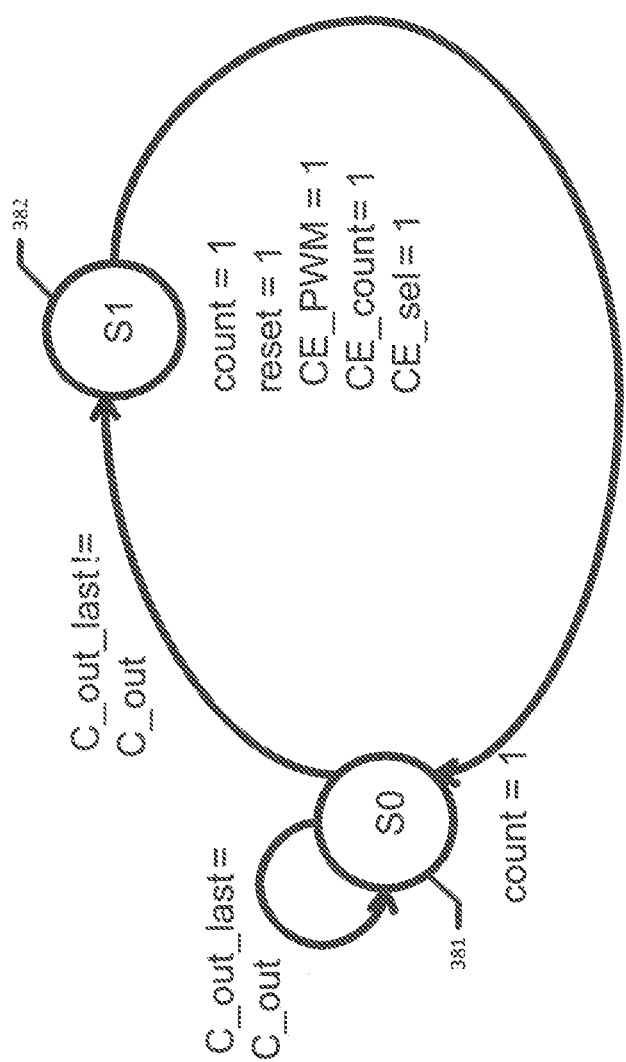
FIG. 3A is an exemplary state diagram illustrating example operation of the duty cycle measurement circuit of FIG. 3.

Referring now to FIG. 3A, a state diagram illustrating example operation of the duty cycle measurement circuit 352 of FIG. 3 is shown. The duty cycle measurement circuit 352 is first initialized at a state S0 (denoted by reference numeral 381). When the first duty cycle of the first comparator output signal 353a and the second duty cycle of the second comparator output signal 353b are substantially the same, a counter (e.g. counter 356) begins counting and the duty cycle measurement circuit 352 remains at a state S0.

In contrast, when the first duty cycle of the first comparator output signal 353a and the second duty cycle of the second comparator output signal 353b are not substantially the same, the counter (e.g., counter 356) resets to zero and the duty cycle measurement circuit 352 transitions to a state S1 (denoted by reference numeral 382). As described above in conjunction with FIG. 3, the first comparator output signal can be representative of a current comparator output signal C_out, while the second comparator output signal can be representative of a previous comparator output signal C_out_last. Additionally, as discussed above, in a preferred embodiment a desired duty cycle of the first comparator output signal and the second comparator output signal will be 50 percent, but it is not so limited.

While in a state S1, which is representative of the exemplary magnetic field sensor (e.g., 100, shown in FIG. 1) making a subsequent measurement of the magnetic field (e.g., 112, shown in FIG. 1), a comparator (e.g., 130, shown in FIG. 1) outputs a new comparator output signal (e.g., 130a, shown in FIG. 1), which is representative of a new first comparator output signal with a first duty cycle (i.e., a current comparator output signal, C_out). It is to be appreciated that previous first comparator output signal with a first duty cycle is now representative of a second comparator output signal with a second duty cycle (i.e., a previous comparator output signal, C_out_last). The duty cycle measurement circuit 352 is coupled to receive the first comparator output signal with a first duty cycle and the second comparator output with a second duty cycle at an input thereof. If the first duty cycle and the second duty cycle are substantially the same, the counter (e.g., 356) counts up, and a pulse width modulation (denoted by CE_PWM) variable, a count (denoted by CE_count) value, and a selection value (denoted by CE_sel) are all set to a predetermined value (e.g. a value of 1), with the duty cycle measurement circuit 352 returning to an initial state S0. As described above in conjunction with FIG. 3, CE_sel may be a select bit on the multiplexor (364, shown in FIG. 3).

Alternatively, while in a state S1, if the first duty cycle and the second duty cycle are not substantially the same, the duty cycle measurement circuit 352 can output a duty cycle adjust signal 372a at an output thereof. The duty cycle adjust signal 372a, as previously discussed, can be received by an offset signal generator circuit (e.g., 54, shown in FIG. 1). The duty cycle adjust signal 372a can appear as a PWM output signal or continuous signal, depending upon the particular application and configuration of the exemplary magnetic field sensor (e.g., 100, shown in FIG. 1). A CE_PWM value of 1 can, for example, indicate a PWM output signal. Alternatively, a CE_PWM value of 0 can, for example, denote a PWM output signal.

As described above in conjunction with FIG. 1, the offset signal generator (e.g., 154, shown in FIG. 1) can then generate an offset signal (e.g., 150a, shown in FIG. 1) with a duty cycle (e.g., a predetermined duty cycle or corrected duty cycle). According to some embodiments, the duty cycle measurement circuit 352 remains in the state S1 until the first duty cycle of the first comparator output signal 353a and the second duty cycle of the second comparator output signal 353b are again substantially the same, at which point the duty cycle measurement circuit 352 subsequently returns to a state S0.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor for sensing an external magnetic field, the sensor comprising:
   at least one magnetic field sensing element for measuring a magnetic field produced by a first magnetic field generating source;
   a current generator configured to receive one or more drive current signals at an input thereof and to generate a drive current signal having a periodic waveform and an amplitude offset at an output thereof;

a second magnetic field generating source configured to receive the drive current signal at an input thereof and in response thereto, provide a magnetic field to the at least one magnetic field sensing element;

a comparator configured to receive a reference voltage as a first input and an output signal from the at least one magnetic field sensing element as a second input, and in response thereto to generate a comparator output signal having a duty cycle; and a compensation circuit configured to receive the comparator output signal having a duty cycle at an input thereof and to generate an offset signal for correcting the duty cycle to a predetermined duty cycle as an output wherein a characteristic of the offset signal is that it is proportional to a magnitude of the external magnetic field experienced by the magnetic field sensing element when the duty cycle of the comparator output signal is substantially the same as the predetermined duty cycle.

2. The magnetic field sensor of claim 1 further comprising;

a temperature compensation circuit coupled to the first input of said comparator to adjust the reference voltage in response to temperature changes.

3. The magnetic field sensor of claim 2, wherein said temperature compensation circuit comprises a memory device coupled to an input of said comparator, said memory device configured to store a plurality of reference voltage values with each of the plurality of reference voltage values associated with at least one temperature range.

4. The magnetic field sensor of claim 3, wherein said temperature compensation circuit further comprises a digital-to-analog converter (DAC) coupled between said memory device and the first input of said comparator, wherein said DAC converts a digital representation of a reference voltage value retrieved from said memory device to an analog voltage.

5. The magnetic field sensor of claim 4, wherein said temperature compensation circuit further comprises a temperature sensor coupled to said memory device, wherein said temperature sensor senses a temperature and outputs a temperature sensing value to said memory device.

6. The magnetic field sensor of claim 1, wherein the magnetic field generating source comprises an H-bridge circuit coupled to a coil.

7. The magnetic field sensor of claim 1, wherein the compensation circuit comprises a controller configured to generate an offset signal for correcting the duty cycle as an output.

8. The magnetic field sensor of claim 1, wherein the offset signal is generated in response to the duty cycle of the comparator output signal.

9. The magnetic field sensor of claim 1, wherein the at least one magnetic sensing element is a magnetoresistance element.

10. The magnetic field sensor of claim 1, wherein the periodic waveform is substantially symmetric.

11. The magnetic field sensor of claim 1, wherein the periodic waveform is triangular.

12. The magnetic field sensor of claim 1, wherein the drive current signal has an amplitude selected to drive the magnetic field sensing element into saturation.

13. The magnetic field sensor of claim 1, wherein the drive current signal is associated with the offset signal.

14. The magnetic field sensor of claim 1, wherein the output of the magnetic field sensor is the offset signal, wherein the offset signal may comprise an analog voltage or a representative digital value.

15. The magnetic field sensor of claim 1, wherein the output of the magnetic field sensor is the drive current signal.

16. The magnetic field sensor of claim 1, wherein the compensation circuit is configured to generate the offset signal such that the duty cycle of the comparator output signal remains a fixed value, wherein the fixed value is the predetermined duty cycle.

17. The magnetic field sensor of claim 16, wherein the fixed value is 50 percent.

18. A method of sensing an external magnetic field with a magnetic field sensor having hysteresis, the method comprising:

generating a drive current signal having a periodic waveform and an amplitude offset at an output thereof;

generating a magnetic field from said drive current signal and applying said magnetic field to a magnetic field sensing element;

comparing an output of the magnetic field sensing element to a reference signal to generate a comparison output signal having a duty cycle characteristic; and generating an offset signal for correcting the duty cycle from the comparison output signal to a predetermined duty cycle wherein a characteristic of the offset signal is that it is proportional to the external magnetic field experienced by the magnetic field sensing element when the duty cycle of the comparison output signal is substantially the same as the predetermined duty cycle.

19. The method of claim 18, the method further comprising:

providing an output of the magnetic sensing element to a first input of a comparator;

providing a reference voltage to a second input of the comparator;

generating a comparison output signal from said first input and said second input of the comparator, wherein said comparison signal has a duty cycle; and providing the comparison output signal to an input of a compensation circuit.

20. The method of claim 19, wherein providing a reference voltage to a second input of the comparator comprises:

converting a digital value to an analog voltage; and providing the analog voltage to the second input of the comparator.

21. The method of claim 19, wherein providing a reference voltage to a second input of the comparator comprises:

storing a plurality of reference voltage values in a memory device with each of the reference voltage values being associated with at least one temperature range;

selecting a reference voltage;

converting the reference voltage value to an analog voltage; and providing the analog voltage to the second input of the comparator.

22. The method of claim 19, wherein providing a reference voltage to a second input of the comparator comprises:

sensing a temperature;

generating a temperature sensing value as a digital value;

converting the digital value to an analog voltage; and providing the analog voltage to the second input of the comparator.

23. The method of claim 18, wherein generating a magnetic field from said drive current signal and applying said magnetic field to a magnetic field sensing element comprises generating the magnetic field with an H-bridge circuit coupled to a coil which receives said drive current signal.

24. The method of claim 18, wherein generating an offset signal for correcting the duty cycle from the comparison output signal wherein a characteristic of the offset signal is that it is proportional to the external magnetic field experienced by the magnetic sensing element in steady-state comprises:

receiving said comparison output signal; and generating an offset signal for correcting the duty cycle from said comparison output signal in a controller wherein a characteristic of the offset signal is proportional to the external magnetic field experienced by the magnetic sensing element when the duty cycle of the comparison output signal is substantially the same as the predetermined duty cycle.

25. The method of claim 18, wherein generating a drive current signal having a periodic waveform and an amplitude offset at an output thereof comprises:

generating a drive current signal having a substantially symmetric periodic waveform and an amplitude offset at an output thereof.

26. The method of claim 18, wherein generating a drive current signal having a periodic waveform and an amplitude offset at an output thereof comprises:

generating a drive current signal having a triangular periodic waveform and an amplitude offset at an output thereof.

27. The method of claim 18, wherein generating a drive current signal having a periodic waveform characteristic with an offset comprises:

generating a drive current signal having an amplitude selected to drive the magnetic field sensing element into saturation.

28. The method of claim 18, wherein the drive current signal is associated with the offset signal.

29. The magnetic field sensor of claim 1, wherein the predetermined duty cycle is representative of a duty cycle of the one or more drive current signals received by the current generator.

30. The method of claim 18, wherein the predetermined duty cycle is representative of a duty cycle of the one or more drive current signals received by the current generator.

31. The magnetic field sensor of claim 9, wherein the magnetoresistance element is an anisotropic magnetoresistance (AMR) element.

32. The magnetic field sensor of claim 9, wherein the magnetoresistance element is one of: a giant magnetoresistance (GMR) element; a tunneling magnetoresistance (TMR) element; a magnetic tunnel junction (MTJ) element; or a spin valve element.

33. The magnetic field sensor of claim 1, wherein the at least one magnetic sensing element is a Hall effect element.

* * * * *